(12) United States Patent
Hegde

(10) Patent No.: US 10,216,443 B2
(45) Date of Patent: Feb. 26, 2019

(54) PROACTIVELY DESELECT STORAGE UNITS FOR ACCESS DURING MAJOR GEOGRAPHIC EVENTS

(71) Applicant: International Business Machines Corporation, Armonk, NY (US)

(72) Inventor: Harsha Hegde, Hawthorn Woods, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 99 days.

(21) Appl. No.: 15/340,017

(22) Filed: Nov. 1, 2016

(65) Prior Publication Data
US 2017/0153828 A1 Jun. 1, 2017

Related U.S. Application Data

(60) Provisional application No. 62/260,743, filed on Nov. 30, 2015.

(51) Int. Cl.
*G06F 3/06* (2006.01)
*H03M 13/15* (2006.01)
(Continued)

(52) U.S. Cl.
CPC ............ *G06F 3/0635* (2013.01); *G06F 3/064* (2013.01); *G06F 3/067* (2013.01); *G06F 3/0611* (2013.01);
(Continued)

(58) Field of Classification Search
CPC .... G06F 3/0611; G06F 3/0614; G06F 3/0617; G06F 3/0619; G06F 3/0635; G06F 3/064;
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Christian M Dorman
(74) *Attorney, Agent, or Firm* — Garlick & Markison; Timothy W. Markison; Randy W. Lacasse

(57) ABSTRACT

A method for execution by one or more processing modules of a dispersed storage network (DSN), the method begins when accessing a multi-site DSN, by determining, for each site, whether the site is able to favorably support slice access. Unfavorable conditions include any of: weather-related site availability information that is greater than a weather threshold level, seismic activity at the site is greater than a seismic threshold level, general environmental conditions at the site are unfavorable, building fire conditions, unauthorized site physical access conditions, power supply conditions, or network connectivity conditions. The method continues, for each site that is able to favorably support slice access, by selecting one or more storage units to support the accessing. The method continues by issuing access requests to the selected one or more storage units and receiving access responses from at least a threshold number of the selected one or more storage units.

20 Claims, 6 Drawing Sheets

(51) Int. Cl.

| | |
|---|---|
| *G06F 11/10* | (2006.01) |
| *G06F 11/07* | (2006.01) |
| *G06F 17/30* | (2006.01) |
| *H04L 29/08* | (2006.01) |
| *H03M 13/00* | (2006.01) |
| *H04L 12/18* | (2006.01) |

(52) U.S. Cl.
CPC .......... *G06F 3/0617* (2013.01); *G06F 3/0619* (2013.01); *G06F 3/0659* (2013.01); *G06F 11/0727* (2013.01); *G06F 11/1076* (2013.01); *G06F 11/1092* (2013.01); *G06F 17/30569* (2013.01); *H03M 13/1515* (2013.01); *H03M 13/616* (2013.01); *H04L 12/18* (2013.01); *H04L 67/1008* (2013.01); *H04L 67/1097* (2013.01); *H04L 67/2823* (2013.01)

(58) Field of Classification Search
CPC ...... G06F 3/0653; G06F 3/0659; G06F 3/067; G06F 11/0727; G06F 11/1076; G06F 11/1092; G06F 17/30194; G06F 17/30569; G06F 2201/85; G06F 2201/86; H03M 13/1515; H03M 13/616; H04L 12/18; H04L 67/1008; H04L 67/1097; H04L 67/2823
See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0245082 | A1* | 10/2007 | Margolus ............ G06F 11/1096 711/114 |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2016/0182338 | A1* | 6/2016 | Ragupathi ............... H04L 67/02 709/224 |
| 2017/0083603 | A1* | 3/2017 | Minder ............ G06F 17/30598 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

(56) References Cited

OTHER PUBLICATIONS

Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner distributed, or dispersed, storage network (DSN) 10

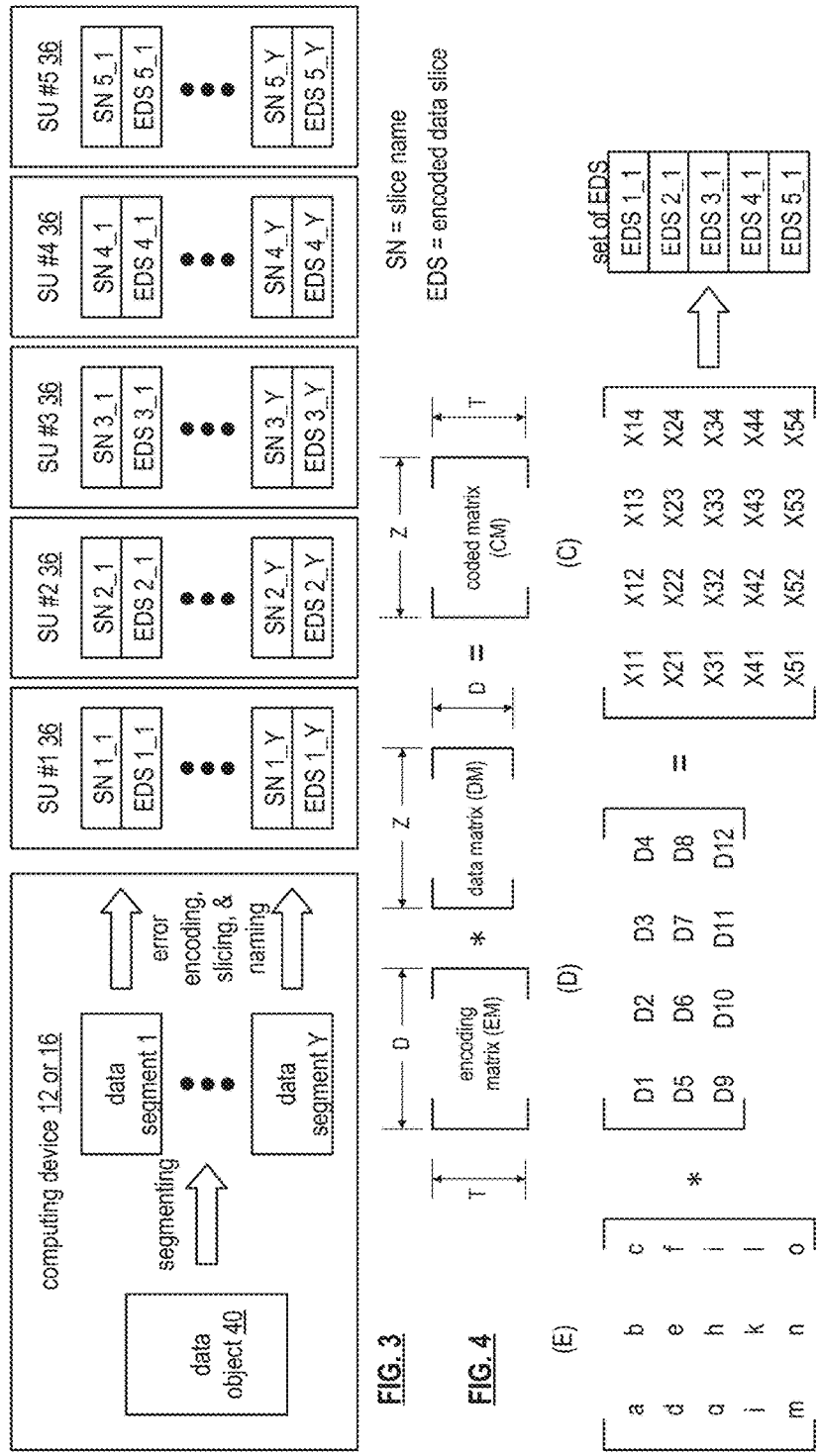

PROACTIVELY DESELECT STORAGE UNITS FOR ACCESS DURING MAJOR GEOGRAPHIC EVENTS

CROSS-REFERENCE TO RELATED APPLICATIONS

The present U.S. Utility Patent Application claims priority pursuant to 35 U.S.C. § 119(e) to U.S. Provisional Application No. 62/260,743, entitled "COMMUNICATING DISPERSED STORAGE NETWORK STORAGE UNIT TASK EXECUTION STATUS," filed Nov. 30, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
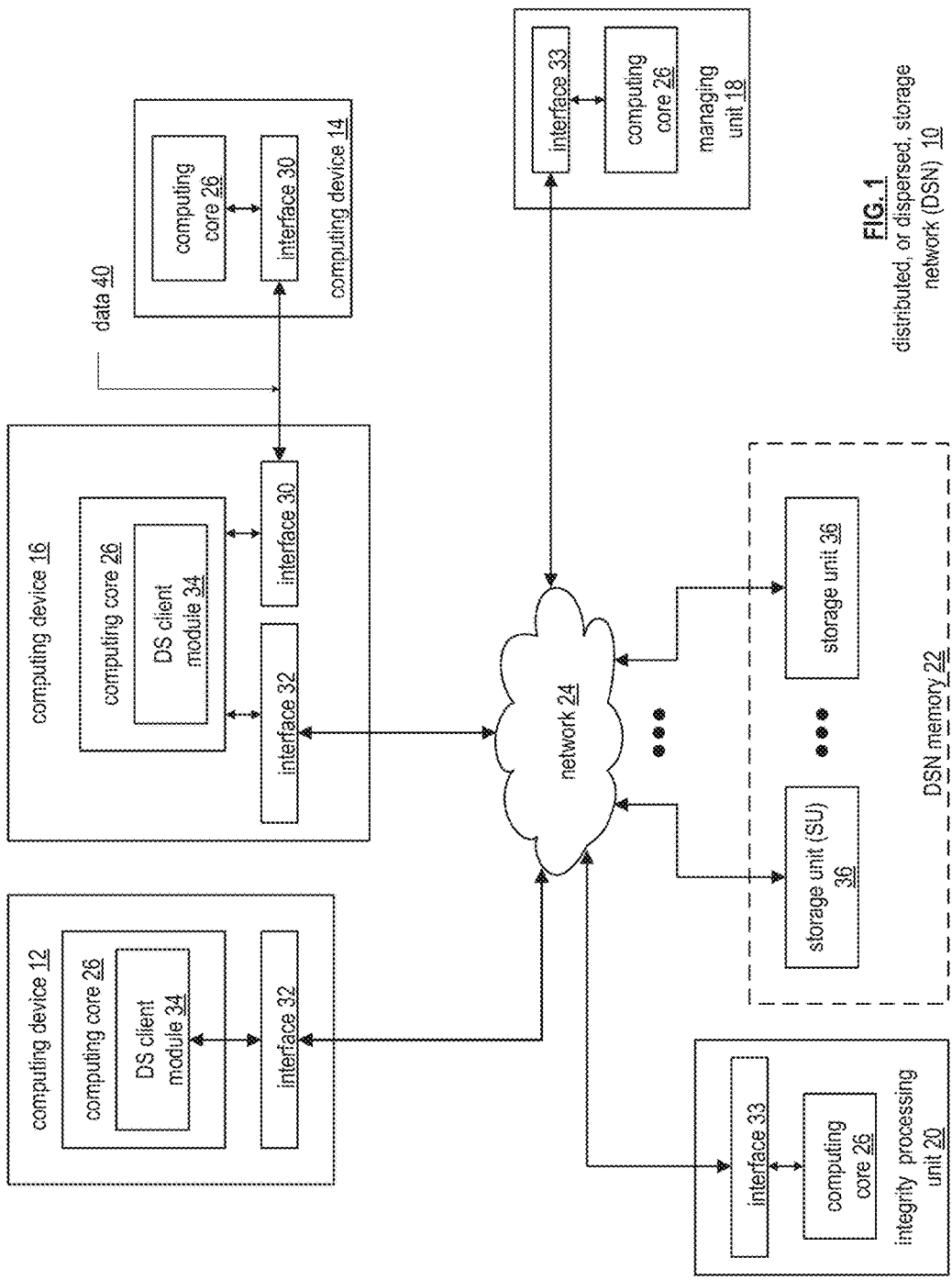
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
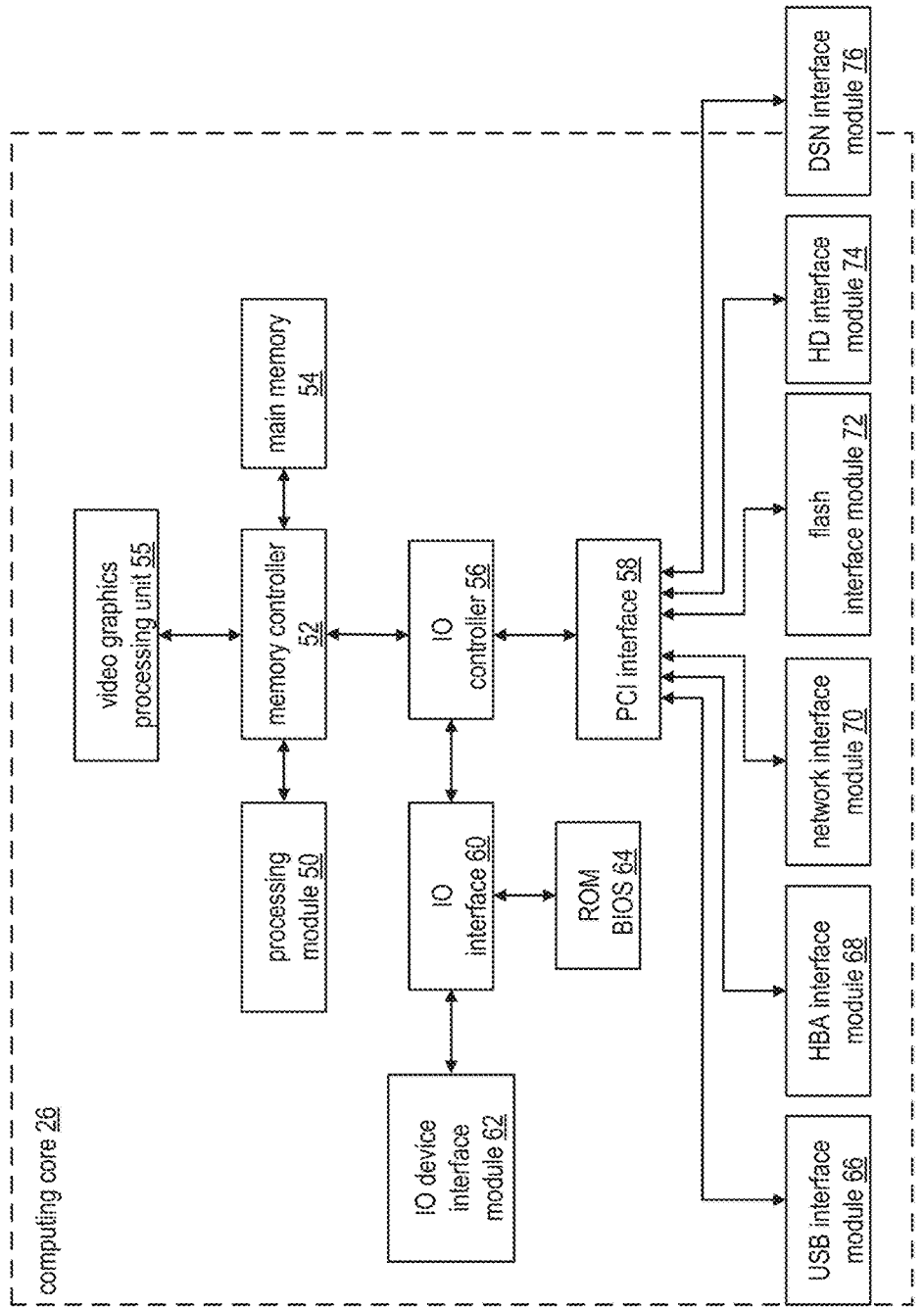
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate per-access billing information. In another instance, the DSTN managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
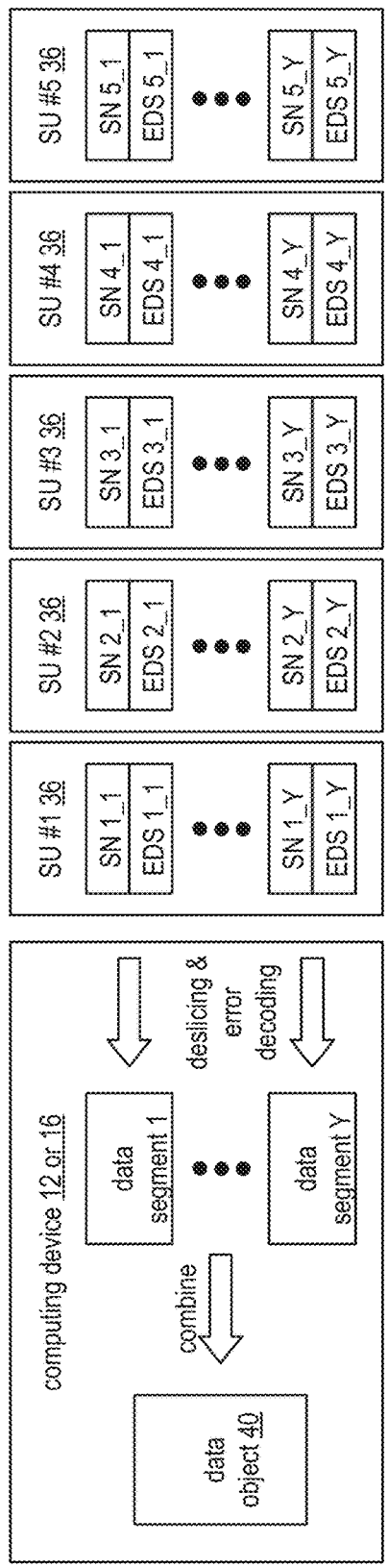
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
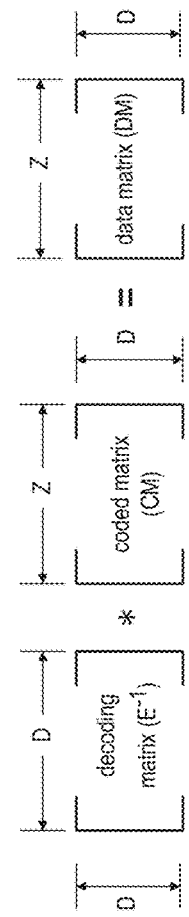
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

In one embodiment, a DS unit proactively deselects sites for reading and writing individual slice data since the site is experiencing or expects to experience major geographic event (like earthquake, tsunami etc.). The DS units at the site (data center) receive ETWS/CMAS warnings locally (through physical monitors) or externally through a system like GPS or Cellular network and pause read and writes to the site proactively, if threshold reads and writes can still be accomplished through other non-impacted sites. If this is not possible, DS unit will return failures to the requesters requesting access with the appropriate reason codes. This allows DSN memory to prevent data corruption and poor performance during major geographic events. This also allows the DSN memory to indicate the actual major geographic events to the client requesting access to the storage with the appropriate reason codes.

Figure 9:
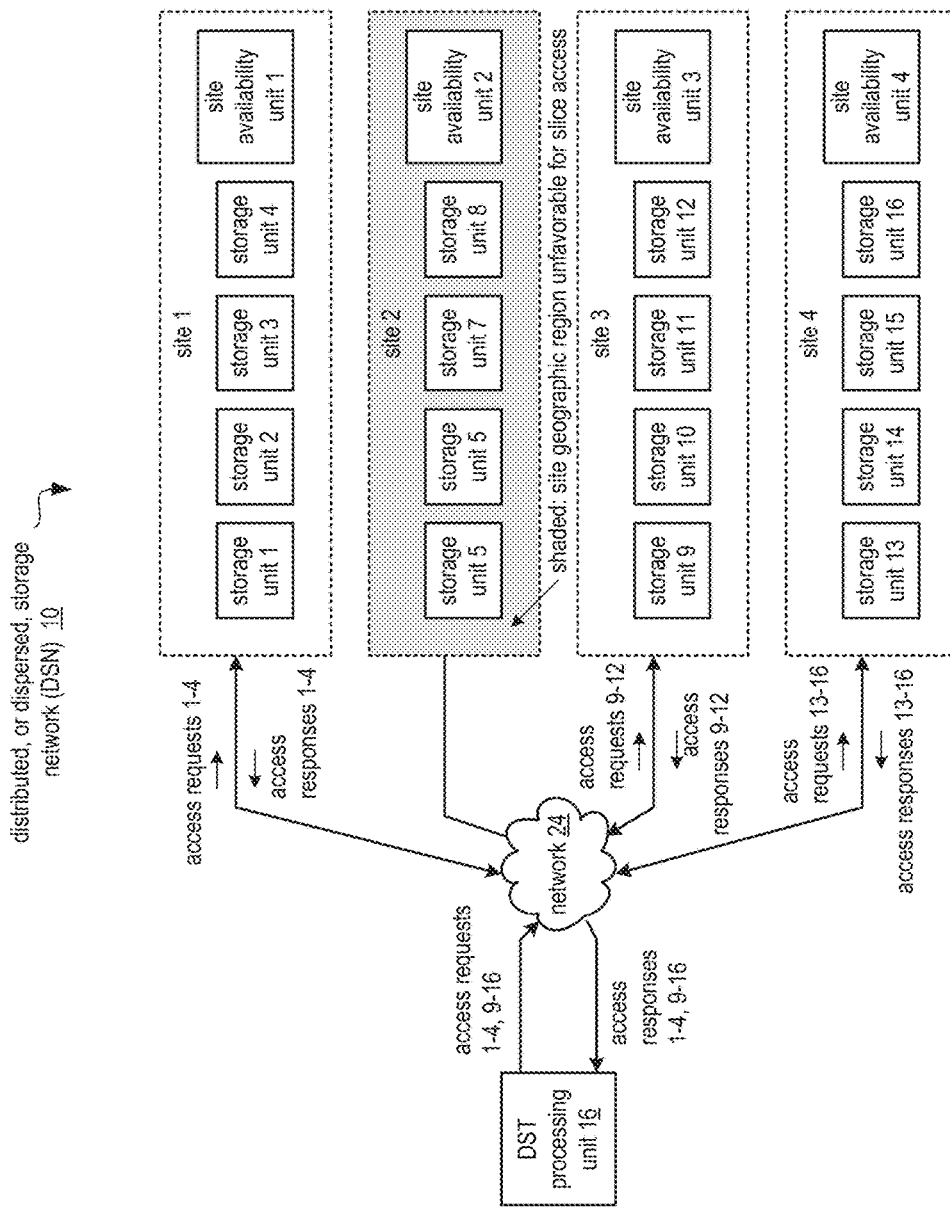
FIG. 9 is a schematic block diagram of an embodiment of a dispersed storage network (DSN) in accordance with the present invention.

FIG. 9 is a schematic block diagram of another embodiment of a dispersed storage network (DSN) that includes the distribute storage and task (DST) processing unit 16 (computing device) of FIG. 1, the network 24 of FIG. 1, a set of storage units 1-16 (e.g., distributed over sites 1-4), and one or more site availability units 1-4. Each storage unit may be implemented utilizing the DST execution unit 36 of FIG. 1. Each site availability unit may be implemented utilizing one or more of a storage unit, the DST execution unit 36 (storage unit (SU)) of FIG. 1, a server, and the DST processing unit 16. Each site availability unit may be implemented at a corresponding site of a plurality of sites 1-4, for example, the site availability unit 1 is implemented at site 1, the site availability unit 2 is implemented at site 2, the site availability unit 3 is implemented at site 3, and the site availability unit 4 is implemented at site 4.

The set of storage units 1-16 are deployed across the plurality of sites 1-4 such that at least one storage unit is implemented at each site to provide a site diversity system improvement, and where unavailability of at least one site will not disrupt an ability of the DST processing unit 16 to access data stored in the set of storage units, where the DST processing unit 16 dispersed storage error encodes data utilizing an information dispersal algorithm (IDA) in accordance with IDA parameters to produce one or more sets of encoded data slices, where each set of encoded data slices includes an IDA width number of encoded data slices, where the one or more sets of encoded data slices are stored in the set of storage units, and where a decode threshold number of encoded data slices of each of the one or more sets of encoded data slices are required to recover the data. For example, storage units 1-4 are implemented at the site 1, storage units 5-8 are implemented at the site 2, storage units 9-12 are implemented at the site 3, and storage units 13-16 are implemented at the site 4 when the decode threshold number is 10 and the IDA width is 16 (e.g., as many as 12 storage units are available from other sites when the site 2 is unavailable).

From time to time, local conditions with respect to a particular site may impact operation (e.g., ability to access encoded data slices stored in at least some of the storage units at site) of the storage units associated with the site. The local conditions include weather conditions, seismic conditions, building fire conditions, unauthorized site physical access conditions, power supply conditions, or network connectivity conditions. The DSN functions to select storage resources based on detected local conditions.

In an example of operation of the selecting of the storage resources, when accessing the set of storage units, the DST processing unit 16 determines, for each site, whether the site is able to favorably support slice access. The determining includes at least one of obtaining centralized site availability information, obtaining the site availability information (availability status) from a corresponding site availability unit of the site, interpreting a query response, interpreting a test result, or indicating a level of support of the slice access based on the obtained site availability information. For example, the DST processing unit 16 receives unfavorable site availability information from the site availability unit 2 indicating unavailability of the site 2 due to weather-related site local conditions and indicates that the site 2 is unable to favorably support the slice access.

For each available site, the DST processing unit 16 selects one or more storage units of the available sites to support the slice access. The selecting is based on one or more of the site availability information, storage unit availability information, storage unit performance information, storage unit capacity information, and the IDA parameters (e.g., IDA width, decode threshold number). For example, the DST processing unit 16 selects storage units 1-4, 9-12, and 13-16 when the sites 1, 3, and 4 are available and the decode threshold is 10 (e.g., 12 storage units have been selected to satisfy the minimum requirement of 10).

Having selected the storage units and sites, the DST processing unit 16 issues access requests to the selected storage units. For example, the DST processing unit 16 generates access requests 1-4, and 9-16, sends, via the network 24, the access requests 1-4, and 9-16 to the corresponding storage units 1-4, and 9-16. Having sent the access request, the DST processing unit 16 receives access responses from at least some of the storage units, where each storage unit receiving a corresponding access request issues, via the network 24, an associated access response when site availability information associated with the storage unit is favorable. For example, the DST processing unit 16 receives, via the network 24, access responses 1-4, and 9-16 (9-12 and 13-16).

Figure 9A:
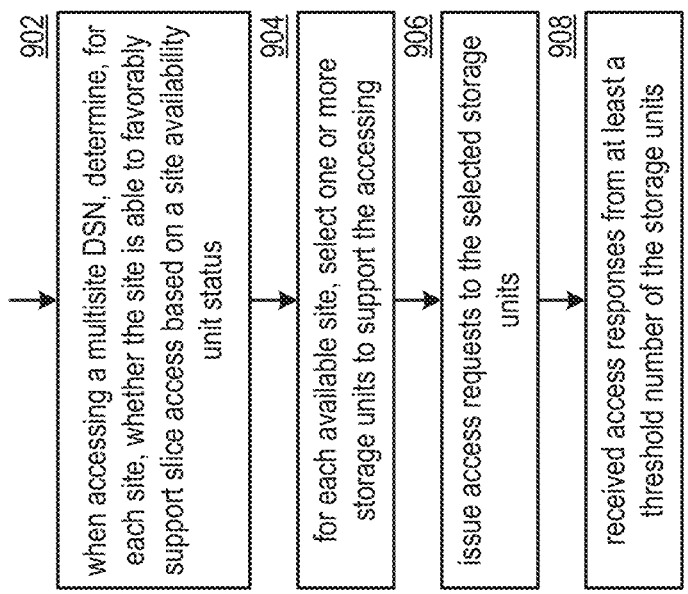
FIG. 9A is a logic diagram of an example of a method of selecting storage resources in accordance with the present invention.

FIG. 9A is a flowchart illustrating an example of selecting storage resources. In particular, a method is presented for use in conjunction with one or more functions and features described in conjunction with FIGS. 1-2, 3-8, 9 and also FIG. 9A.

The method includes a step 902 where a processing module (e.g., of a distributed storage and task (DST) processing unit), when accessing a multi-site dispersed storage network (DSN), determines, for each site, where the site is able to favorably support slice access. The determining includes one or more of obtaining centralized site availability information, obtaining the site availability information from a site availability unit at the site, interpreting a query response, interpreting a test result, indicating favorable support of the slice access when the obtained site availability information is favorable, or indicating unfavorable support of the slice access when the obtained site availability information is unfavorable.

For each available site, the method continues at step 904 where the processing module selects one or more storage units to support the accessing. The selecting may be based on one or more of the site availability information, storage unit availability information, storage unit performance information, storage unit capacity information, or dispersal parameters utilized to encode data to produce the slices of the slice access.

The method continues at step 906 where the processing module issues access requests to the selected storage units. The issuing includes generating the access requests and sending the access requests to the selected storage units. The method continues at step 908 where the processing module receives access responses from at least some of the storage units (e.g., a threshold). For example, when the site availability information is favorable, a storage unit receiving a corresponding access request generates an associated access response and sends the generated access response to a requesting entity.

The method described above in conjunction with the processing module can alternatively be performed by other modules of the dispersed storage network or by other computing devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc.

that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the method comprises:

receiving warnings indicating a major geographic event occurring at a DSN site;

when accessing a multi-site DSN, determining, for each DSN site, whether the DSN site is able to favorably support encoded data slice access based on site availability information, wherein the site availability is based on whether the DSN site is experiencing or expects to experience the major geographic event, and wherein encoded data slices are dispersed in a plurality of the DSN sites in a threshold number of storage units using a data segmenting protocol with per data segment encoding values including: a pillar width, number (T) of encoded data slices per encoding of a data segment; a decode threshold number (D) of encoded data slices of a set of encoded data slices that are needed to recover the data segment; a read threshold number (R) of encoded data slices to indicate a number of encoded data slices per set to be read from storage for decoding of the data segment; and a write threshold number (W) to indicate a number of encoded data slices per set that must be accurately stored before the encoded data slices are deemed to have been properly stored;

for each DSN site that cannot favorably support encoded data slice access based on the site availability and access responses from at least a threshold number of storage units, wherein the threshold number includes any of D, R or W:

pausing read and writes to the DSN site proactively;

transferring the paused read and writes to other non-impacted DSN sites; and returning failures to requesters requesting access to the DSN site with appropriate reason codes;

for each non-impacted DSN site that is able to favorably support encoded data slice access and the threshold number (D, R or W) of storage units, selecting one or more storage units to support the accessing;

issuing access requests to the selected one or more storage units; and receiving access responses from at least the threshold number (D, R or W) of the selected one or more storage units.

2. The method of claim 1, wherein the determining includes any of: obtaining centralized site availability information, obtaining the site availability information from a site availability unit of the DSN site, interpreting a query response, interpreting a test result, or indicating favorable support of the encoded data slice access based on the site availability information.

3. The method of claim 2, wherein the site availability information includes unavailability when weather-related site information is greater than a weather threshold level.

4. The method of claim 2, wherein the site availability information includes unavailability when seismic activity at the DSN site is greater than a seismic threshold level.

5. The method of claim 2, wherein the site availability information includes unavailability when general environmental conditions at the DSN site are unfavorable.

6. The method of claim 2, wherein the site availability information includes unavailability based on site specific building fire conditions, unauthorized site physical access conditions, power supply conditions, or network connectivity conditions.

7. The method of claim 1, wherein the selecting is based on one or more of: the site availability information, storage unit availability information, storage unit performance information, storage unit capacity information, or dispersal parameters.

8. The method of claim 1, wherein the issuing is based on: generating an access request, and sending, via a network, the access request to the selected one or more storage units.

9. The method of claim 8, wherein the receiving is based on: when the site availability information is favorable, generating, by the selected one or more storage units receiving a corresponding one of the access requests, a corresponding one of the access responses, and sending, via a network, the access response.

10. A computing device of a group of computing devices of a dispersed storage network (DSN), the computing device comprises:

an interface;

a local memory; and a processing module operably coupled to the interface and the local memory, wherein the processing module functions to:

receive warnings indicating a major geographic event is occurring at a DSN site;

when accessing a multi-site DSN, determine, for each DSN site, whether the DSN site is able to favorably support encoded data slice access based on site availability information, wherein the site availability is based on whether the DSN site is experiencing or expects to experience the major geographic event, and wherein encoded data slices are dispersed in a plurality of the DSN sites in a threshold number of storage units using a data segmenting protocol with per data segment encoding values including: a pillar width, number (T) of encoded data slices per encoding of a data segment; a decode threshold number (D) of encoded data slices of a set of encoded data slices that are needed to recover the data segment; a read threshold number (R) of encoded data slices to indicate a number of encoded data slices per set to be read from storage for decoding of the data segment; and a write threshold number (W) to indicate a number of encoded data slices per set that must be accurately stored before the encoded data slices are deemed to have been properly stored;

for each DSN site that cannot favorably support encoded data slice access based on the site availability and access responses from at least a threshold number of storage units, wherein the threshold number includes any of D, R or W:

pause read and writes to the DSN site proactively;

transfer the paused read and writes to other non-impacted DSN sites; and return failures to requesters requesting access to the DSN site with appropriate reason codes;

for each non-impacted DSN site that is able to favorably support encoded data slice access and the threshold number (D, R or W) of storage units, select one or more storage units to support the accessing;

issue access requests to the selected one or more storage units; and received access responses from at least the threshold number (D, R or W) of the selected one or more storage units.

11. The computing device of claim 10, wherein the determining includes any of: obtaining centralized site availability information, obtaining the site availability information from a site availability unit of the DSN site, interpreting a query response, interpreting a test result, or indicating favorable support of the encoded data slice access based on the site availability information.

12. The computing device of claim 11, wherein the site availability information includes unavailability when weather-related site information is greater than a weather threshold level.

13. The computing device of claim 11, wherein the site availability information includes unavailability when seismic activity at the DSN site is greater than a seismic threshold level.

14. The computing device of claim 11, wherein the site availability information includes unavailability when based on any of: site specific building fire conditions, unauthorized site physical access conditions, power supply conditions, or network connectivity conditions.

15. The computing device of claim 10, wherein the selecting is based on one or more of: the site availability information, storage unit availability information, storage unit performance information, storage unit capacity information, or dispersal parameters.

16. The computing device of claim 10, wherein the issuing is based on: generating an access request, and sending, via a network, the access request to the selected one or more storage units.

17. The computing device of claim 16, wherein the receiving is based on: when site availability information is favorable, generating, by the selected one or more storage units receiving a corresponding one of the access requests, a corresponding one of the access responses, and sending, via a network, the access response.

18. A computing device of a group of computing devices of a dispersed storage network (DSN), the computing device comprises:

an interface;

a local memory; and a site availability unit providing site availability information of a DSN site; and a processing module operably coupled to the interface, the local memory and the site availability unit, wherein the processing module functions to:

receive warnings indicating a major geographic event is occurring at a DSN site;

when receiving a request for accessing a plurality of sites of a multi-site DSN, determine based on the site availability information of each of the plurality of sites, whether the DSN site is able to favorably support encoded data slice access, wherein the site availability is based on whether the DSN site is experiencing or expects to experience the major geographic event, and wherein encoded data slices are dispersed in a plurality of the DSN sites in a threshold number of storage units using a data segmenting protocol with per data segment encoding values including: a pillar width, number (T) of encoded data slices per encoding of a data segment; a decode threshold number (D) of encoded data slices of a set of encoded data slices that are needed to recover the data segment; a read threshold number (R) of encoded data slices to indicate a number of encoded data slices per set to be read from storage for decoding of the data segment and a write threshold number (W) to indicate a number of encoded data slices per set that must be accurately stored before the encoded data slices are deemed to have been properly stored;

for each DSN site that cannot favorably support encoded data slice access based on the site availability and access responses from at least a threshold number of storage units, wherein the threshold number includes any of D, R or W:

pause read and writes to the DSN site proactively;

transfer the paused read and writes to other non-impacted DSN sites; and return failures to requesters requesting access to the DSN site with appropriate reason codes;

for each non-impacted DSN site that is able to favorably support encoded data slice access and the threshold number (D, R or W) of storage units, select one or more storage units to support the accessing;

issue access requests to the selected one or more storage units; and received access responses from at least the threshold number (D, R or W) of the selected one or more storage units.

19. The computing device of claim 18, wherein the determining includes any of: obtaining centralized site availability information, obtaining the site availability information from the site availability unit of the DSN site, interpreting a query response, interpreting a test result, or indicating favorable support of the encoded data slice access based on the site availability information.

20. The computing device of claim 18, wherein the site availability information includes unavailability when any of: weather-related site availability information is greater than a weather threshold level, seismic activity at the DSN site is greater than a seismic threshold level, general environmental conditions at the DSN site are unfavorable, building fire conditions, unauthorized DSN site physical access conditions, power supply conditions, or network connectivity conditions.

* * * * *